(12) United States Patent
Kwag et al.

(10) Patent No.: US 11,233,077 B2
(45) Date of Patent: Jan. 25, 2022

(54) VERTICAL BOARD-TYPE CAPACITOR AND IMAGE SENSING DEVICE INCLUDING THE SAME

(71) Applicant: SK hynix Inc., Icheon-si (KR)

(72) Inventors: Pyong Su Kwag, Eumseong-gun (KR); Sung Kun Park, Sejong-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/510,310

(22) Filed: Jul. 12, 2019

(65) Prior Publication Data

US 2020/0212088 A1    Jul. 2, 2020

(51) Int. Cl.
*H01L 27/146* (2006.01)

(52) U.S. Cl.
CPC .... *H01L 27/14603* (2013.01); *H01L 27/1463* (2013.01); *H01L 27/14605* (2013.01); *H01L 27/14636* (2013.01); *H01L 27/14641* (2013.01)

(58) Field of Classification Search
None
See application file for complete search history.

(56) References Cited

U.S. PATENT DOCUMENTS

| | | | |
|---|---|---|---|
| 2011/0310282 A1* | 12/2011 | Toda | H01L 31/0322 348/308 |
| 2020/0035724 A1* | 1/2020 | Machida | H01L 27/14603 |
| 2020/0168646 A1* | 5/2020 | Suler | H01L 27/14614 |
| 2020/0212092 A1* | 7/2020 | Kwag | H01L 27/14609 |

* cited by examiner

*Primary Examiner* — Steven B Gauthier
(74) *Attorney, Agent, or Firm* — Perkins Coie LLP

(57) ABSTRACT

An image sensing device is provided to include a pixel region including image pixels and a peripheral region located outside of the pixel region. The peripheral region includes logic circuits located to receive the pixel signals from the pixel region and configured to process the pixel signals, and a capacitor located adjacent to the logic circuits. The capacitor includes an active region including a first impurity region and a second impurity region formed over the first impurity region, a recessed structure including a portion formed in the active region, the portion including a conductive layer extending along a direction that the first impurity region and the second impurity region are stacked and an insulation layer formed between the conductive layer and the active region, and a first junction formed in the active region and spaced apart from the recessed structure by a predetermined distance.

16 Claims, 15 Drawing Sheets

VERTICAL BOARD-TYPE CAPACITOR AND IMAGE SENSING DEVICE INCLUDING THE SAME

CROSS-REFERENCE TO RELATED APPLICATION

This patent document claims the priority and benefits to Korean patent application No. 10-2018-0172826 filed on Dec. 28, 2018, which is hereby incorporated in its entirety by reference.

TECHNICAL FILED

The technology and implementations disclosed in this patent document relate to an image sensing device.

BACKGROUND

An image sensor is a device configured to convert an optical image into an electrical signal. With the increasing development of computer industries and communication industries, demand for high-quality and high-performance image sensors is rapidly increasing in various fields, for example, digital cameras, camcorders, personal communication systems (PCSs), game consoles, surveillance cameras, medical micro-cameras, robots, etc.

SUMMARY

Various implementations of the disclosed technology are directed to a vertical board-type capacitor and an image sensing device including the vertical board-type capacitor.

Some implementations of the disclosed technology relate to a vertical board-type capacitor for increasing capacitance per unit region, and an image sensing device including the vertical board-type capacitor.

In one aspect, an image sensing device is provided to include a pixel region including image pixels and structured to produced pixel signals in response to light received in the pixel region, and a peripheral region located outside of the pixel region. The peripheral region may include logic circuits located to receive the pixel signals from the pixel region and configured to process the pixel signals, and a capacitor located adjacent to the logic circuits. The capacitor may include an active region, a recessed structure, and a first junction. The active region may include a first impurity region and a second impurity region formed over the first impurity region. The recessed structure may include a conductive layer and an insulation layer. The conductive layer may extend along a direction that the first impurity region and the second impurity region are stacked. The insulation layer may be formed between the conductive layer and the active region. The first junction may be formed in the active region and be spaced apart from the recessed structure by a predetermined distance.

In accordance with another aspect of the disclosure technology, a vertical board-type capacitor may include an active region formed in a substrate, a trench formed in the active region and having a predetermined depth in a vertical direction, a conductive layer having a portion buried in the trench, an insulation layer formed in the trench and disposed between the conductive layer and the active region, and a first junction formed in the active region and spaced apart from the insulation layer by a predetermined distance. The portion of the conductive film may extend in a horizontal plane and may extend in a vertical plane.

It is to be understood that both the foregoing general description and the following detailed description of embodiments are exemplary and explanatory.

BRIEF DESCRIPTION OF THE DRAWINGS

The above and other features and advantages of the present disclosure will become readily apparent by reference to the following detailed description when considered in conjunction with the accompanying drawings wherein.

DETAILED DESCRIPTION

Reference will now be made in detail to certain embodiments, examples of which are illustrated in the accompanying drawings. Wherever possible, the same reference numbers will be used throughout the drawings to refer to the same or like parts. In the following description, a detailed description of related known configurations or functions incorporated herein will be omitted when it may make the subject matter less clear.

Figure 1:
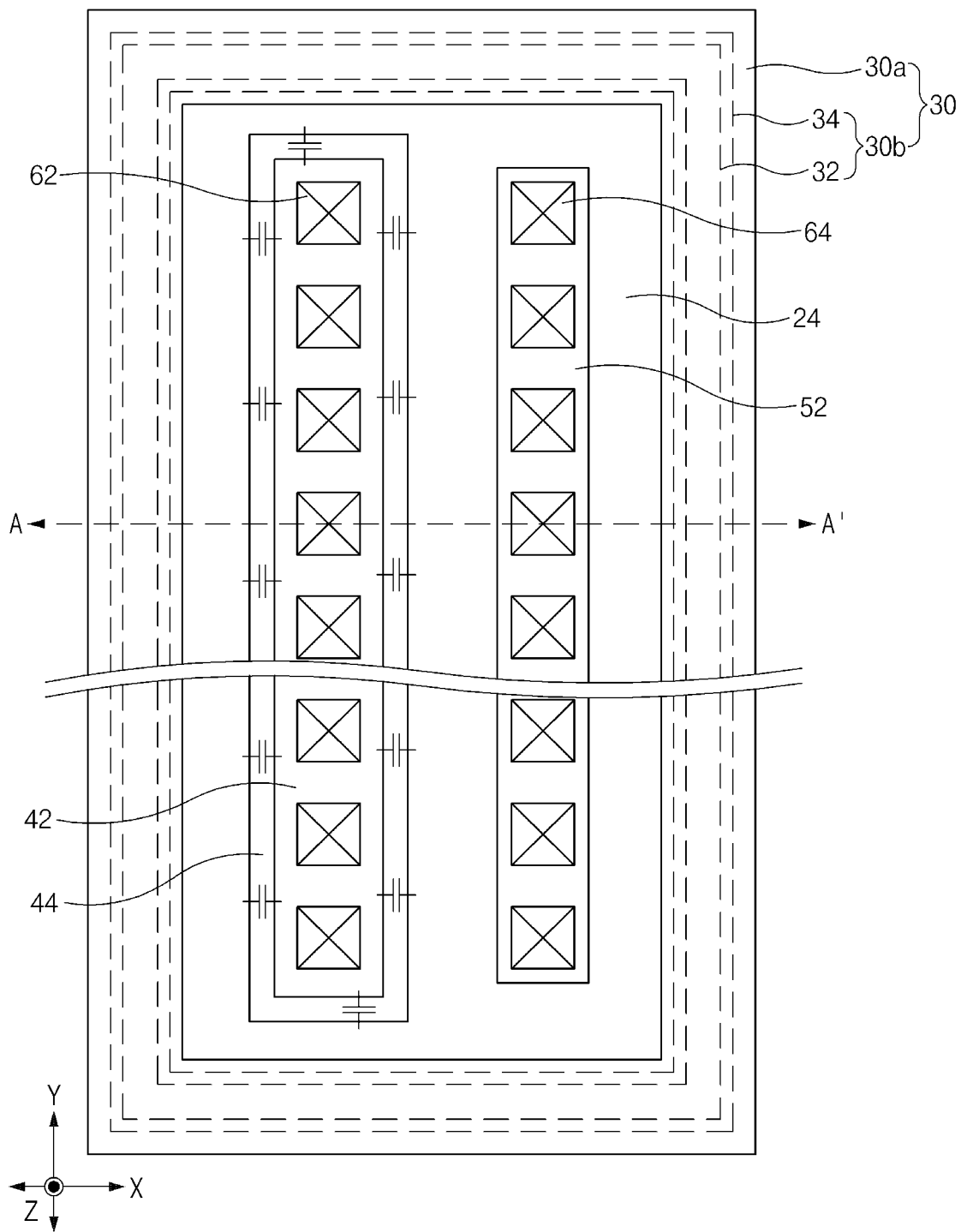
FIG. 1 is a schematic plan view illustrating an example of a vertical board-type capacitor based on one implementations of the disclosed technology.
Figure 2:
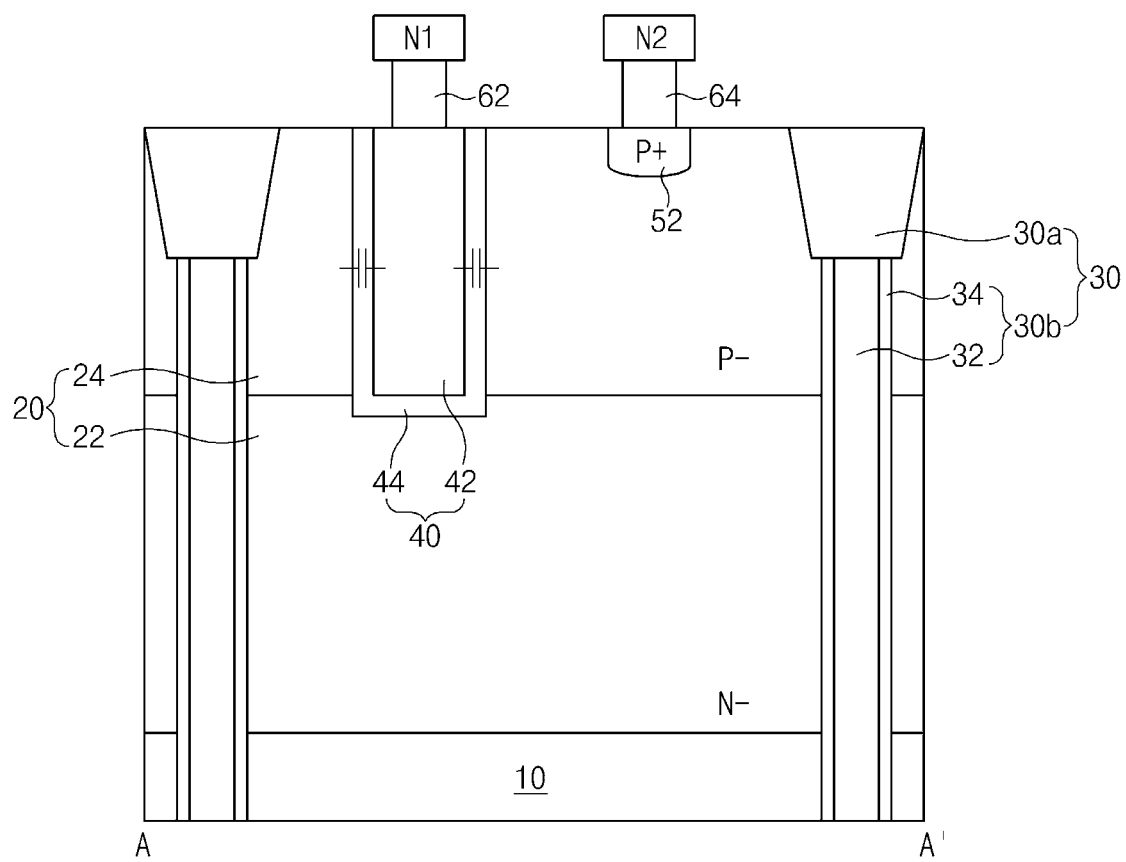
FIG. 2 is a cross-sectional view illustrating an example of the vertical board-type capacitor taken along the line A-A' shown in FIG. 1.

FIG. 1 is a schematic plan view illustrating an example of a vertical board-type capacitor based on one implementation of the disclosed technology. FIG. 2 is a cross-sectional view illustrating the vertical board-type capacitor 1 taken along the line A-A' shown in FIG. 1.

Referring to FIGS. 1 and 2, the vertical board-type capacitor 1 may include an active region 20, a recessed structure 40, and a junction 52.

The active region 20 may be defined by the device isolation structure 30. In some implementations, the active region 20 may be surrounded by the device isolation structure 30.

The active region 20 may be formed by implanting impurities in a substrate 10. For example, the active region 20 may include a stacked structure in which impurity regions 22 and 24 having complementary conductivities are vertically stacked. The active region 20 may be isolated from other regions of the substrate 10 by the device isolation structure 30. The active region 20 may be formed in a planar rectangular shape in which a second-directional length (e.g., Y-direction) is longer than a first-directional length (e.g., X-direction) perpendicular to the second-directional length (i.e., Y-direction).

In the active region 20, an impurity region 22 may be or include an N-type impurity region (N−), and an impurity region 24 formed over the impurity region 22 may be or include a P-type impurity region (P−). The active region 20 may be formed to include the N-type impurity region (N−) and the P-type impurity region (P−) that are vertically stacked.

When the vertical board-type capacitor 1 is applied to an image sensing device, the impurity regions 22 and 24 may be formed simultaneously with formation of a photoelectric conversion element (e.g., photodiode PD) in a pixel region of the image sensing device. For example, N-type impurities (N−) and P-type impurities (P−) in the impurity region 22 and the impurity region 24 may be implanted simultaneously with the implantation of N-type impurities (N−) in the substrate 10 of the pixel region and the implantation of P-type impurities (P−) in the substrate 10 of the pixel region.

The substrate 10 may include a semiconductor substrate. The semiconductor substrate may be in a monocrystalline state, and may have a silicon-containing material. For example, the substrate 10 may include a monocrystalline silicon-containing material. The substrate 10 may be or include a thin film substrate that is formed as a thin film through a thinning process. For example, the substrate 10 may be a bulk-silicon substrate that is formed as a thin film through the thinning process. The substrate 10 may include P-type impurities.

The device isolation structure 30 may be formed to define the active region 20 in which the vertical board-type capacitor 1 is formed. The device isolation structure 30 may isolate the active region 20 from other regions of the substrate 10. For example, the device isolation structure 30 may be formed to surround the active region 20 while passing through the substrate 10.

The device isolation structure 30 may include at least one of a Shallow Trench Isolation (STI) structure 30a and a Deep Trench Isolation (DTI) structure 30b. For example, as shown in FIG. 2, the device isolation structure 30 may be formed by vertically stacking the STI structure 30a and the DTI structure 30b. In this case, the DTI structure 30b may be formed in a multilayer structure in which different material films (or layers) 32 and 34 are horizontally stacked. For example, the DTI structure 30b may be formed by horizontally stacking different insulation films (or layers). Although the implementation is described with the material film, the implementation is not limited to the film and other structures such as a layer are also possible.

In some implementations, the DTI structure 30b may be formed in a multilayer structure in which a conductive film is formed and insulation films surround the conductive film. For example, the DTI structure 30b may include two different material films 32 and 34 such that the material film 32 may be formed of or include a conductive material (e.g., a polysilicon film), and the material film 34 surrounding the material film 32 may be formed of or include an insulation film. When the conductive film 32 is formed in the DTI structure 30b, it is possible to prevent noise from occurring in a boundary region between the DTI structure 30b and the active region 20 by applying potentials to the conductive film 32.

When the vertical board-type capacitor 1 is applied to the image sensing device, the device isolation structure 30 may have a structure identical to the device isolation structure for isolating each unit pixel in the pixel region. Thus, like the device isolation structure 30 of the vertical board-type capacitor 1, the device isolation structure for isolating each unit pixel in the pixel region may be formed as a stacked structure including the STI structure and the DTI structure. In this case, the device isolation structure 30 may be formed simultaneously with the formation of the device isolation structure in the pixel region.

The recessed structure 40 may include a recessed conductive film 42 and a recessed insulation film 44.

In some implementations, the recessed conductive film 42 may be formed to extend in a vertical direction (e.g., Z-direction). For example, at least a part of the recessed conductive film 42 is disposed or buried in the active region 20. The recessed conductive film can have various shapes in a horizontal plane and/or vertical plane. For example, the recessed conductive film 42 may be formed in a bar shape that extends in the Y-direction in the horizontal plane. For example, the recessed conductive film 42 may be formed in a board shape that extends in the Z-direction in the vertical plane. Although a horizontal cross-sectional view of the recessed conductive film 42 is formed in a rectangular bar shape in FIG. 2, other implementations are also possible. For example, in some implementations, the horizontal cross-sectional view of the recessed conductive film 42 may have an elliptical shape.

When the vertical board-type capacitor 1 is applied to the image sensing device, the recessed conductive film 42 may be formed simultaneously with the formation of a gate (e.g., a transfer gate) of a transfer transistor in a pixel region which operates to transmit photocharges converted by the photoelectric conversion element in each unit pixel to a floating diffusion (FD) region. Thus, the transfer gate in the pixel region may be formed to have a recessed shape. In some implementations, the recessed conductive film 42 may be formed of or include the same material as the transfer gate of the pixel region.

The recessed conductive film 42 may be coupled to a node N1 through a contact 62. The node N1 may operate to determine potentials of the recessed conductive film 42 such that a predetermined voltage may be applied to the recessed conductive film 42 through the node N1. Although FIG. 2 shows the specific implementation where the recessed conductive film 42 is buried in the active region 20, other implementations are also possible. For example, in some implementations, an upper region of the recessed conductive film 42 may protrude from the active region 20.

The recessed insulation film 44 may be formed between the recessed conductive film 42 and the active region 20. In some implementations, the recessed insulation film 44 is in contact with side surfaces and a bottom surface of the recessed conductive film 42. Thus, the recessed insulation film 44 may surround the recessed conductive film 42 except a top surface of the recessed conductive film 42. A portion of the recessed insulation film 44 which contacts the bottom surface of the recessed conductive film 42 may be formed to contact the impurity region 22. Portions of the recessed insulation film 44 that are in contact with the side surfaces of the recessed conductive film 42 may be formed to contact the impurity region 24. The recessed insulation film 44 may include an oxide film.

The junction 52 may be used as an impurity region to apply a voltage to the impurity region 24, and may be formed in an upper portion of the impurity region 24. The junction 52 may have the same polarity as the impurity region 24, and may include a P-type impurity region (P+). An impurity density of the junction 52 is higher than that of the impurity region 24. The junction 52 may be coupled to a node N2 through a contact 64. The node N2 may operate to determine potentials of the impurity region 24, and may transmit a predetermined voltage to the impurity region 24 through the contact 64 and the junction 52.

The vertical board-type capacitor 1 can be applied to electronic devices such as a memory device and an image sensing device. In some implementations, the vertical board-type capacitor 1 may be formed in a redundant region located outside a cell array region of the memory device. In some implementations, the vertical board-type capacitor 1 may be formed in a redundant region located outside the pixel region of the image sensing device. Therefore, the X-directional length and the Y-directional length of the vertical board-type capacitor 1 may be adjusted based on the size of a redundant space.

The vertical board-type capacitor 1 may operate as a reservoir capacitor in which electric charges are stored in the insulation film 44 disposed between the recessed conductive film 42 and the impurity region 24 based on the magnitude of voltages received from the nodes N1 and N2. In other words, the capacitance of the vertical board-type capacitor 1 may become the sum of capacitances generated in the recessed insulation film 44 formed in the side surfaces of the recessed conductive film 42. In the vertical board-type capacitor 1, a voltage from the node N2 may not be applied to the impurity region 22. Thus capacitance may not occur in a portion of the insulation film 44 disposed between the recessed conductive film 42 and the impurity region 22. Capacitance of the vertical board-type capacitor can be higher than capacitance of a Metal Oxide Semiconductor (MOS) capacitor having a planar-type gate.

Figure 3:
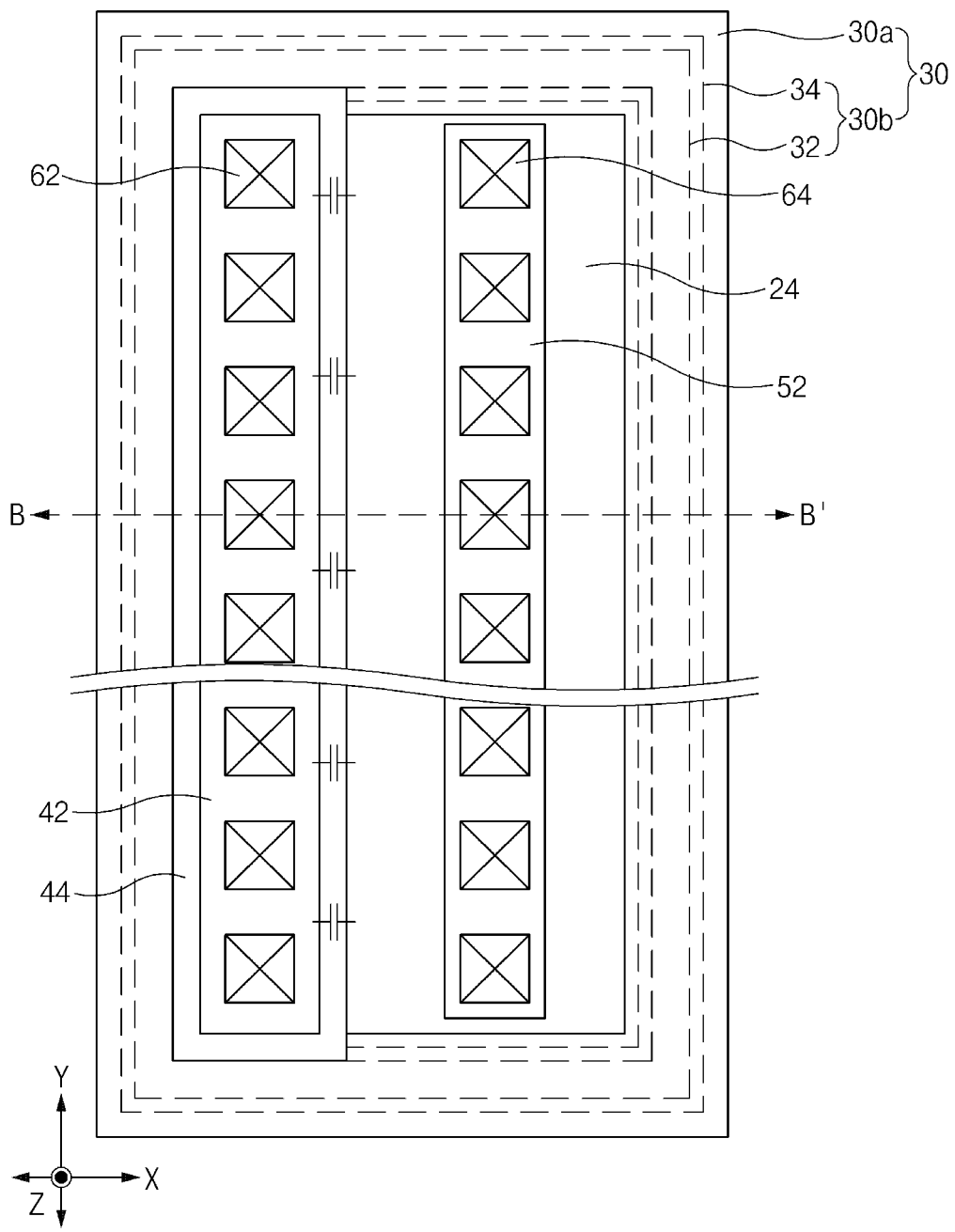
FIG. 3 is a schematic plan view illustrating an example of a vertical board-type capacitor based on one implementation of the disclosed technology.
Figure 4:
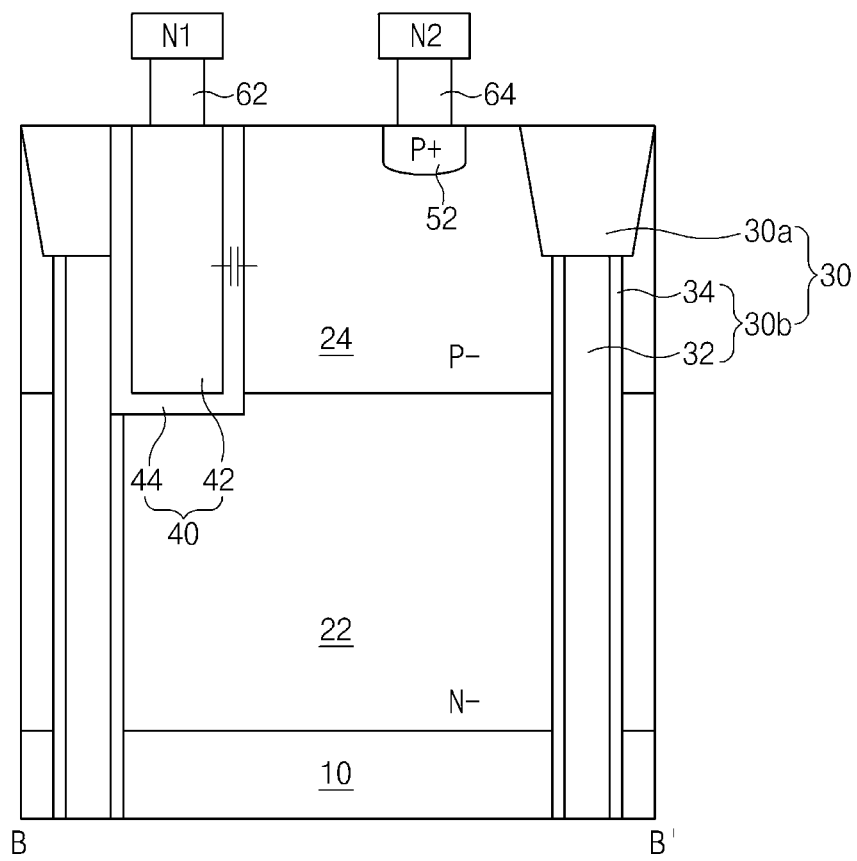
FIG. 4 is a cross-sectional view illustrating an example of the vertical board-type capacitor taken along the line B-B' shown in FIG. 3.

FIG. 3 is a schematic plan view illustrating a vertical board-type capacitor 2 based on another implementation of the disclosed technology. FIG. 4 is a cross-sectional view illustrating the vertical board-type capacitor 2 taken along the line B-B' shown in FIG. 3. For convenience of description, the same reference numerals will be used in FIGS. 3 and 4 for same elements as those in FIGS. 1 and 2.

Referring to FIGS. 3 and 4, the vertical board-type capacitor 2 may be different from the vertical board-type capacitor 1 in terms of the locations of the recessed structure 40 and the junction 52.

In the example as shown in FIGS. 3 and 4, the vertical board-type capacitor 2 is formed in a relatively smaller region than that for the vertical board-type capacitor 1. Referring to FIGS. 3 and 4, some side surfaces of the recessed structure 40 may be formed to contact the device isolation structure 30. In this case, the active region 20 may have a reduced size as compared to that of the active region 20 as shown in FIGS. 1 and 2.

For example, the vertical board-type capacitor 2 may be formed such that one side surface of the recessed insulation film 44 contacts to the device isolation structure 30 and the other side surface of the recessed insulation film 44 does not contact to the device isolation structure 30. The side surface of the recessed insulation film 44 contacting to the device isolation structure 30 is positioned further away from the junction 52 as compared to the other side surface of the recessed insulation film 44 not contacting to the device isolation structure 30. In some implementations, the side surface of the recessed insulation film 44 which contacts to the device isolation structure 30 overlaps the device isolation structure 30.

In the vertical board-type capacitor 2, capacitance may occur only in a portion of the recessed insulation film 44 that does not overlap the device isolation structure 30. Thus, although the vertical board-type capacitor 2 may be formed in a smaller active region than the vertical board-type capacitor 1, the capacitance of the vertical board-type capacitor 2 may be smaller than the capacitance of the vertical board-type capacitor 1.

Figure 5:
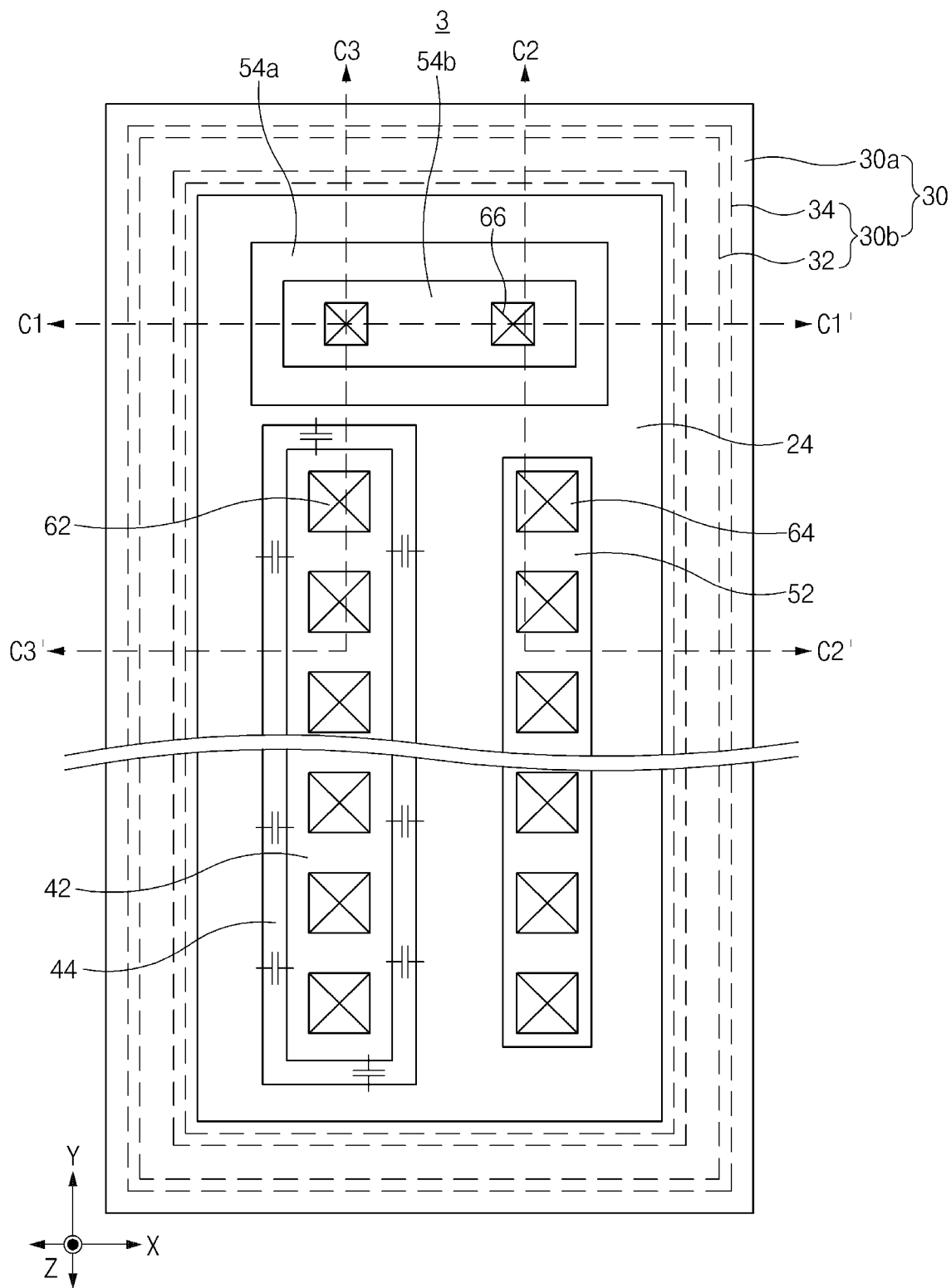
FIG. 5 is a schematic plan view illustrating an example of a vertical board-type capacitor based on one implementation of the disclosed technology.
Figure 6:
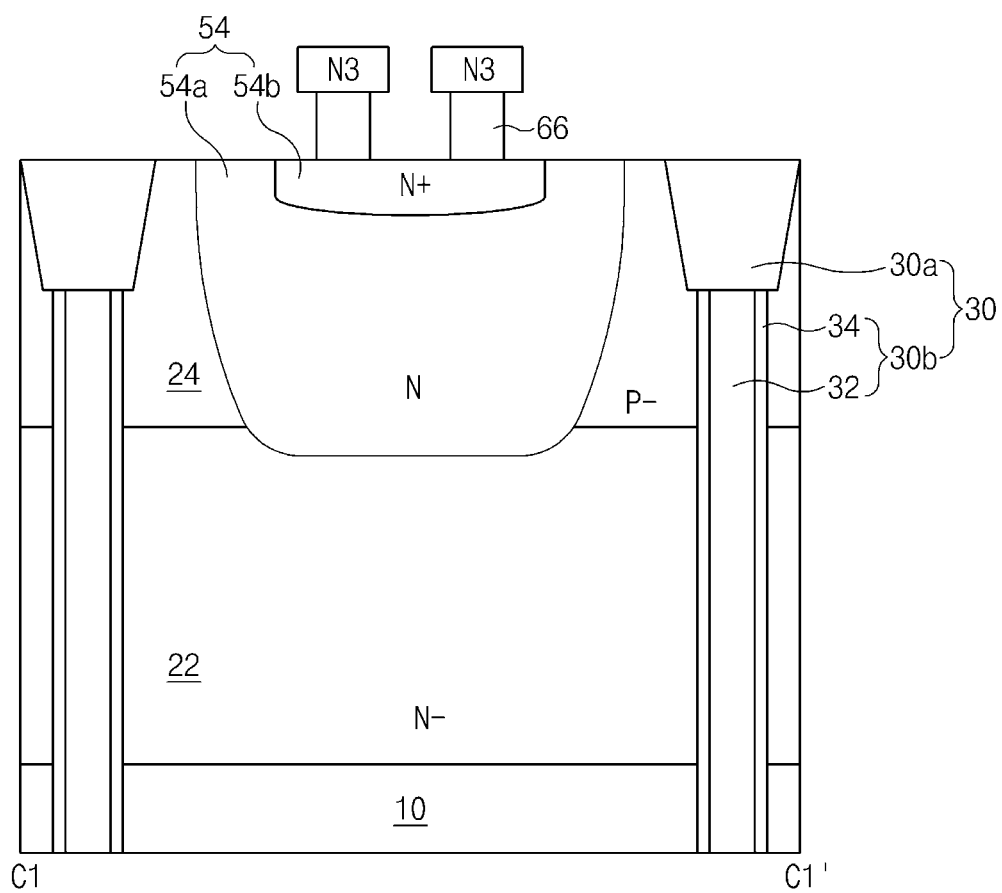
FIGS. 6-8 are cross-sectional views illustrating an example of the vertical board-type capacitor taken along the lines C1-C1', C2-C2', C3-C3' shown in FIG. 5, respectively.
Figure 7:
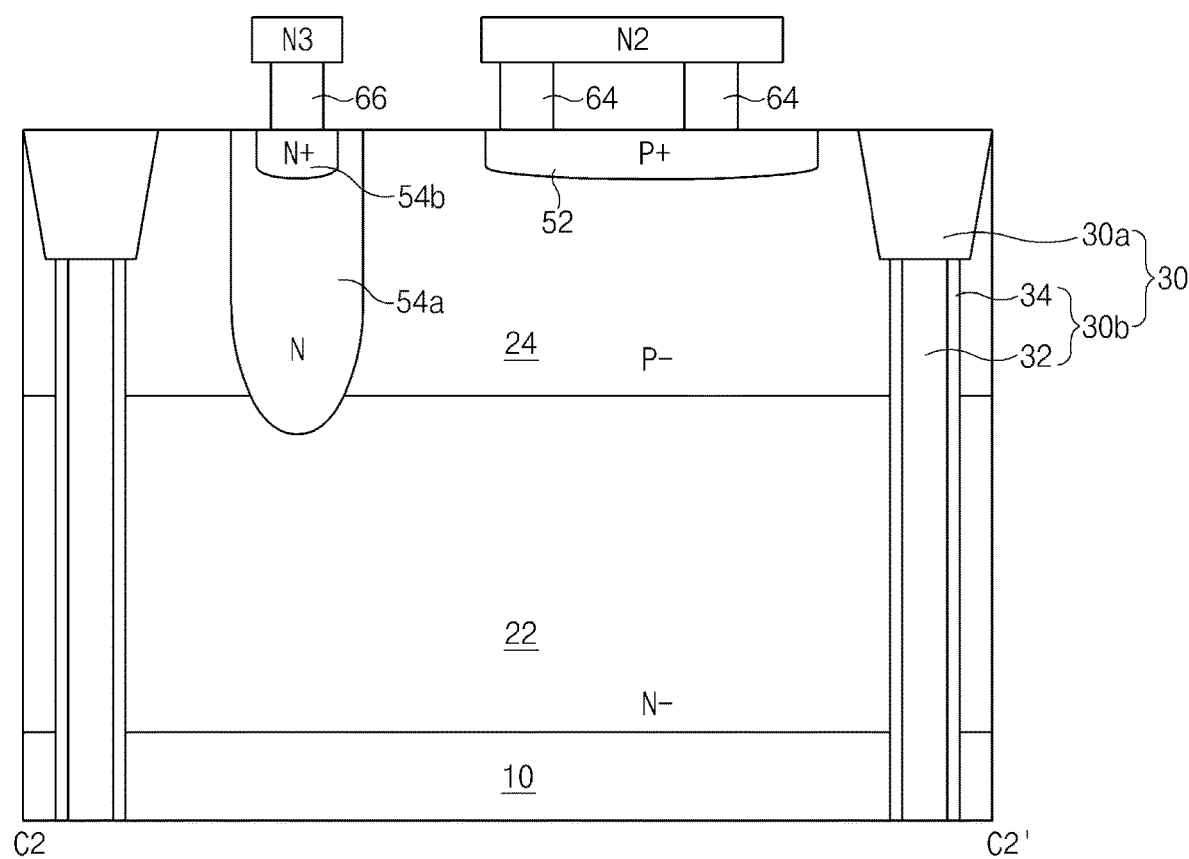
Figure 8:
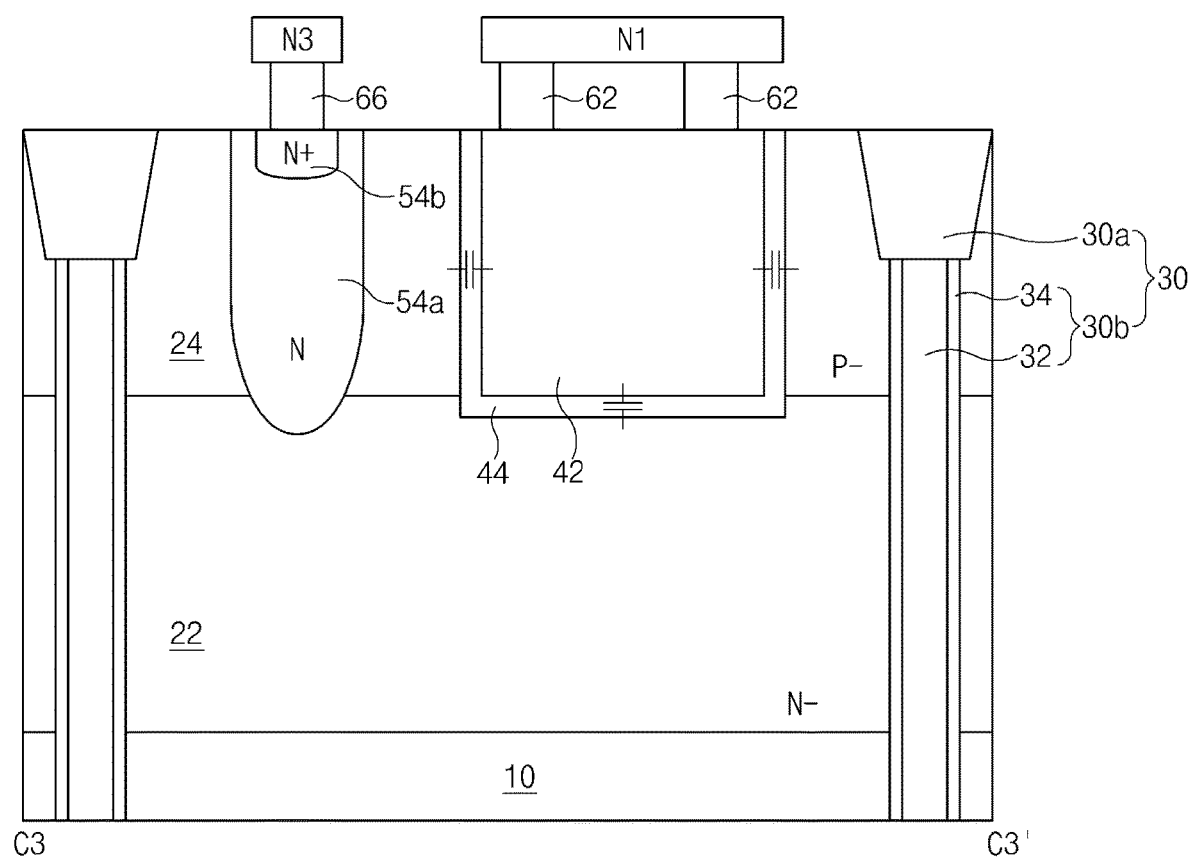

FIG. 5 is a schematic plan view illustrating a vertical board-type capacitor 3 based on another implementation of the disclosed technology. FIG. 6 is a cross-sectional view illustrating the vertical board-type capacitor 3 taken along the line C1-C1' shown in FIG. 5, FIG. 7 is a cross-sectional view illustrating the vertical board-type capacitor 3 taken along the line C2-C2' shown in FIG. 5, and FIG. 8 is a cross-sectional view illustrating the vertical board-type capacitor 3 taken along the line C3-C3' shown in FIG. 5.

Referring to FIGS. 5 to 8, the vertical board-type capacitor 3 may further include a junction 54 that is not included in the vertical board-type capacitor 1 or 2. The junction 54 may provide a space through which a voltage is applied to the impurity region 22 of the active region 20. The junction 54 may include a first impurity region 54a and a second impurity region 54b. The first impurity region 54a may be formed to extend vertically from a top surface of the active region 20 to the impurity region 22. The second impurity region 54b may be formed at a upper portion of the impurity region 54a and be coupled to the contact 66.

The impurity region 54a may include N-type impurities (N), and the impurity region 54b may include N-type impurities (N+). Thus, although the impurity regions 54a and 54b include the same-polarity impurities, the impurity region 54b may have a higher impurity density than that of the impurity region 54a. The impurity region 54b may be coupled to the node N3 through at least one contact 66. The node N3 may operate to determine potentials of the impurity region 22, and may allow a predetermined voltage to be applied to the impurity region 22 through the contacts 66 and the junction 54.

In the vertical board-type capacitor 3, a voltage from the node N2 may be transmitted to the impurity region 24 through the junction 52, and a voltage from the node N3 may be transmitted to the impurity region 22 through the junction 54. Thus, capacitance may occur not only in a portion of the insulation film 44 disposed between the recessed conductive film 42 and the impurity region 24 but also in another portion of the insulation film 44 disposed between the recessed conductive film 42 and the impurity region 22. In this case, capacitance generated in the portion of the insulation film 44 disposed between the recessed conductive film 42 and the impurity region 24 may be different in magnitude from the capacitance generated in another portion of the insulation film 44 disposed between the recessed conductive film 42 and the impurity region 22.

Since the vertical board-type capacitor 3 has an additional portion for the capacitance to occur (e.g., the portion of the insulation film 44 disposed between the recessed conductive film 42 and the impurity region 22), the vertical board-type capacitor 3 can have higher capacitance than the vertical board-type capacitor 1 shown in FIGS. 1 and 2.

In the vertical board-type capacitor 3, a voltage of the impurity region 22 may be constantly maintained to have a fixed value using the voltage of the node N3. By doing so, the vertical board-type capacitor 3 can prevent variation in overall capacitance due to the presence of the impurity region 22.

Figure 9:
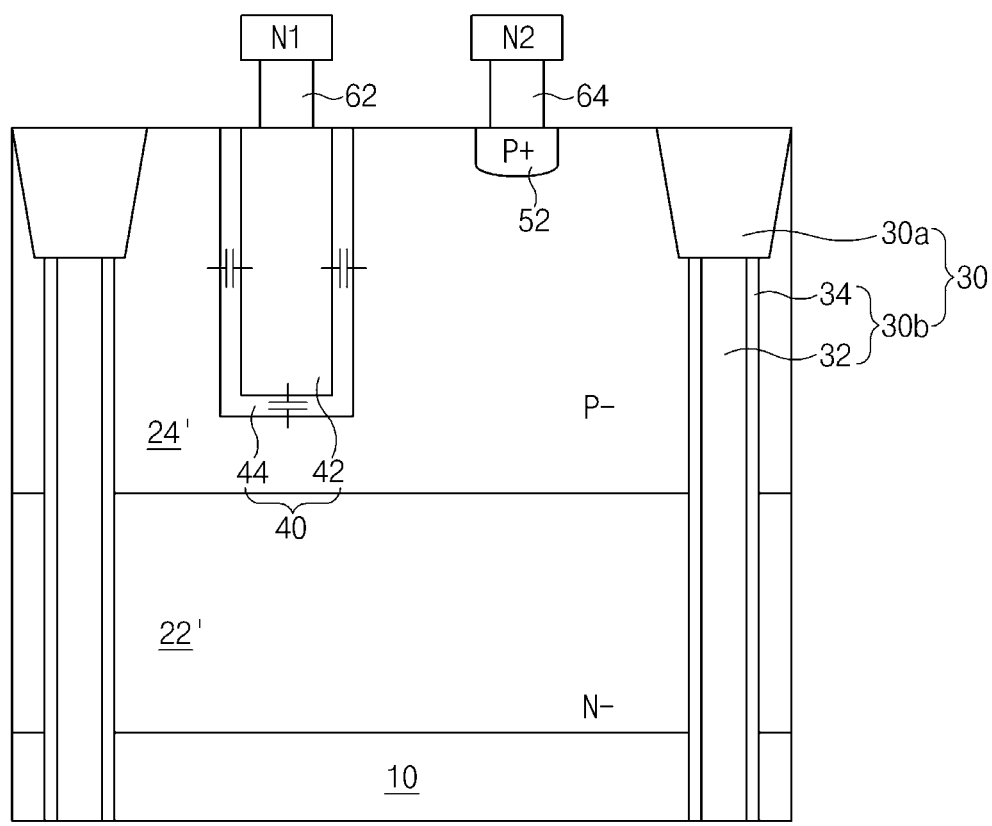
FIGS. 9 and 10 are cross-sectional views illustrating examples of a vertical board-type capacitor based on implementations of the disclosed technology.
Figure 10:
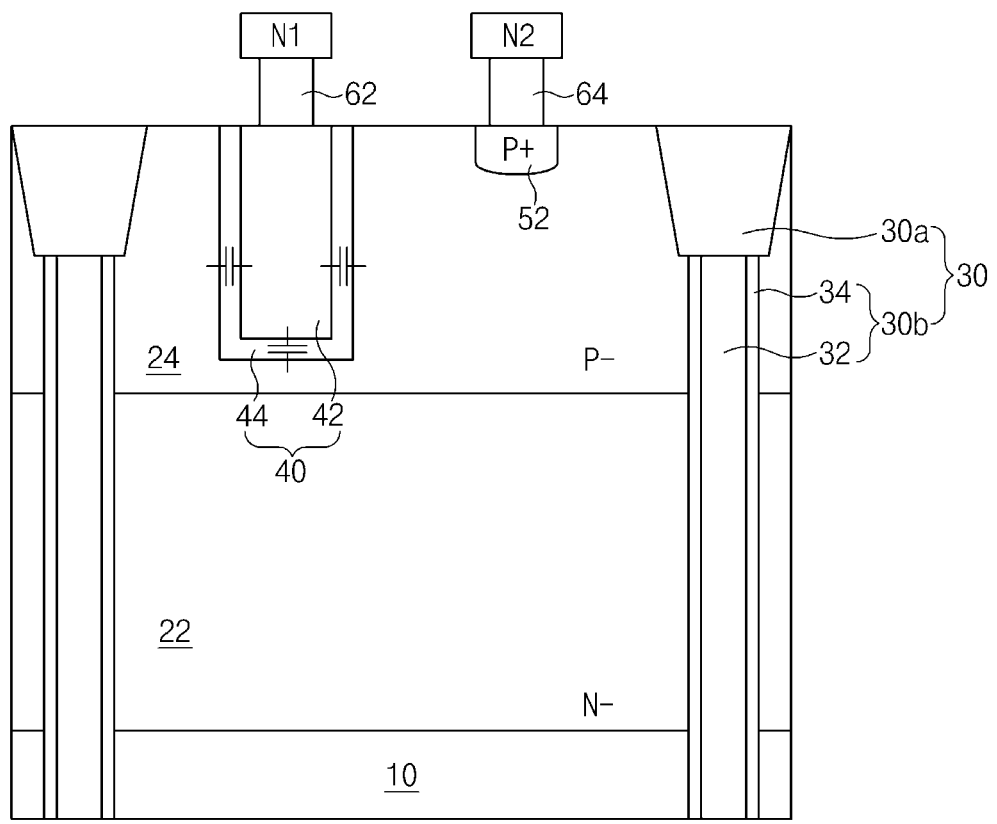

FIG. 9 is a cross-sectional view illustrating a vertical board-type capacitor 4 based on one implementation of the disclosed technology, and FIG. 10 is a cross-sectional view illustrating a vertical board-type capacitor 5 based on one implementation of the disclosed technology.

Referring to FIGS. 9 and 10, the vertical board-type capacitor 4 and the vertical board-type capacitor 5 may be formed to have a recessed structure 40 formed only in the impurity region 24' and the impurity region 24, respectively.

To form the recessed structure 40 only in the impurity regions 24' or 24, other structures of the vertical board-type capacitor 4 or 5 are designed as discussed below.

Compared with the vertical board-type capacitor 1, the vertical board-type capacitor 4 shown in FIG. 9 may have the impurity region 24' extending more in a vertical direction whereas the recessed structure 40 of the vertical board-type capacitor 4 has a same vertical-directional length as that of the recessed structure 40 of the vertical board-type capacitor 1. In this case, the size of the impurity region 22', for example, the vertical directional length of the impurity region 22', may be reduced by the increased size of the extended impurity region 24'.

The vertical board-type capacitor 5 shown in FIG. 10 may have the same-sized impurity regions 22 and 24 as those of the vertical board-type capacitor 1. The recessed structure 40 of the vertical board-type capacitor 5 has a shorter vertical-directional length than that of the recessed structure 40 of the vertical board-type capacitor 1.

In each of the vertical board-type capacitors 4 and 5, the recessed structure 40 may be surrounded by the impurities having a same polarity. This structure is different from the vertical board-type capacitor 1 in which the recessed structure 40 is surrounded by the impurities having different polarities. With the recessed structure 40 surrounded by the same impurities, uniform capacitance may occur in the entire recessed insulation film 44. Thus, it is possible to prevent variation in overall capacitance due to the presence of the impurity region 22 even without the node N3 and the junction 54 that are shown in FIGS. 5-8 and operate to transmit a bias voltage (reference voltage) to the impurity region 22.

Figure 11:
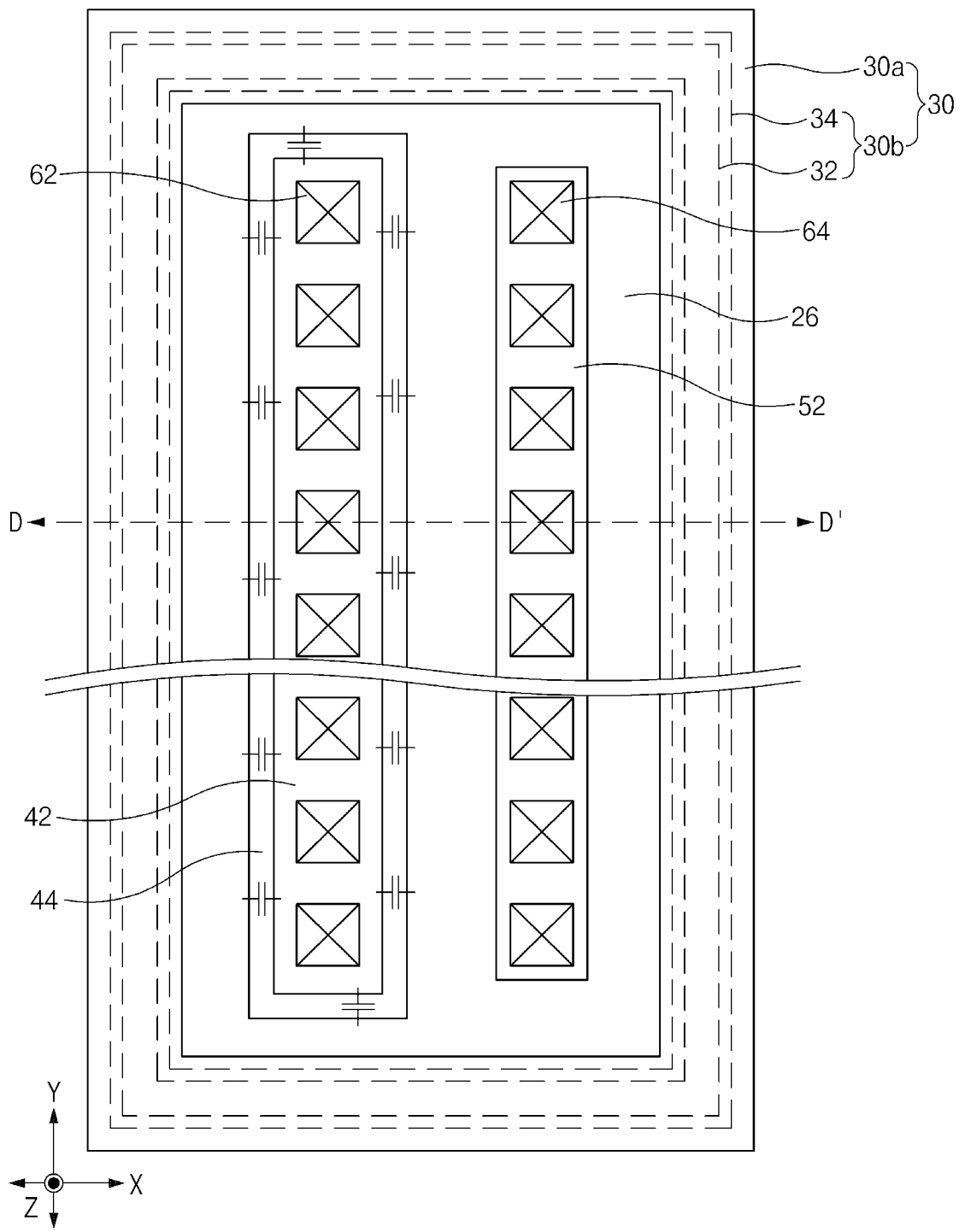
FIG. 11 is a schematic plan view illustrating an example of a vertical board-type capacitor based on one implementation of the disclosed technology.
Figure 12:
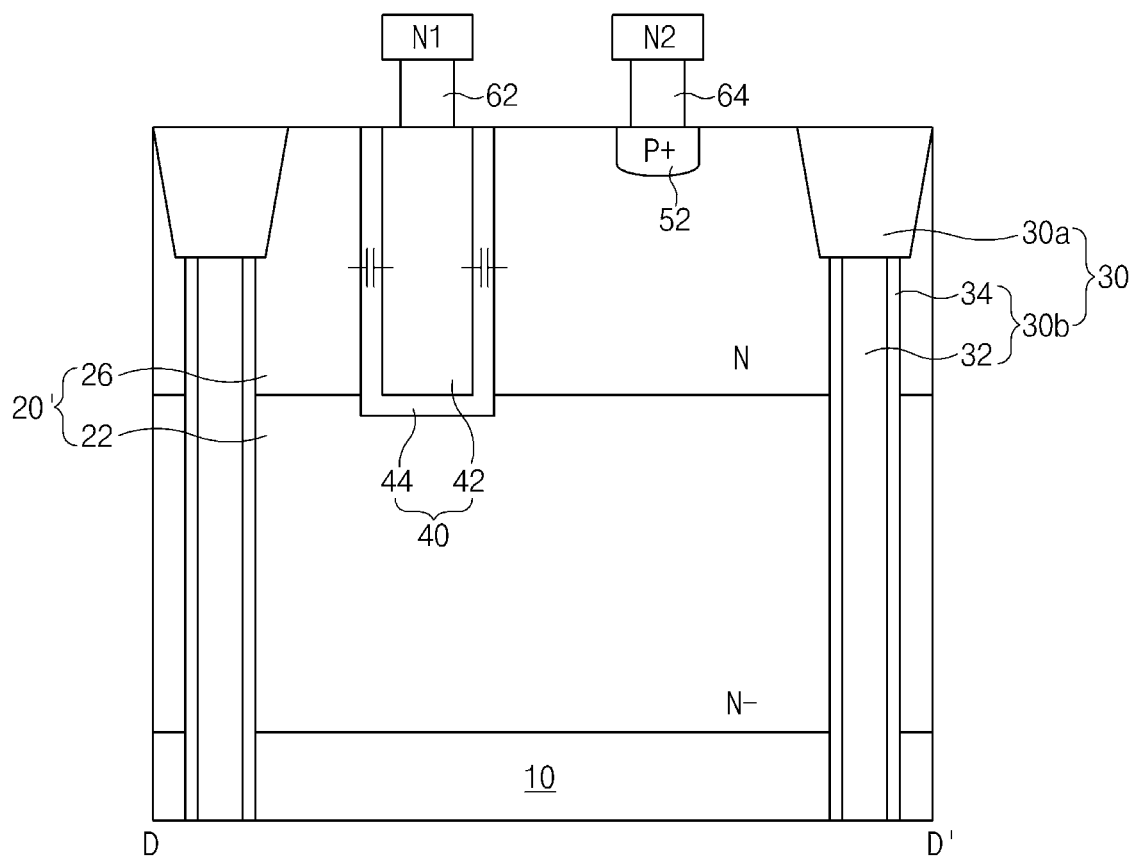
FIG. 12 is a cross-sectional view illustrating an example of the vertical board-type capacitor taken along the line D-D' shown in FIG. 11.

FIG. 11 is a schematic plan view illustrating a vertical board-type capacitor 6 based on one implementation of the disclosed technology. FIG. 12 is a cross-sectional view illustrating the vertical board-type capacitor 6 taken along the line D-D' shown in FIG. 11.

Referring to FIGS. 11 and 12, the vertical board-type capacitor 6 may be different from the vertical board-type capacitor 1 in terms of the impurity structure of the active region 20'.

For example, the active region 20' of the vertical board-type capacitor 6 may include a stacked structure of an impurity region 22 and an impurity region 26, such that the impurity region 22 and the impurity region 26 are vertically stacked in the stacked structure. In the implementation as shown in FIGS. 11 and 12, the impurity region 22 and the impurity region 26 may have the same-polarity impurities but have different impurity densities (N−, N). Unlike the implementation as shown in FIGS. 11 and 12, the vertical board-type capacitor 1 includes a P-type impurity region (P−) 24 and the N-type impurity region 22. In the vertical board-type capacitor 6, the N-type impurity region 26 having the same polarity as the impurity region 22 may be formed over the N-type impurity region 22.

In the implementation as shown in FIGS. 11 and 12, since the recessed structure 40 of the vertical board-type capacitor 6 is surrounded by the impurity regions 22 and 26 having the same-polarity (e.g., N-type), the vertical board-type capacitor 6 can have the uniform capacitance without variation in its capacitance.

Figure 13:
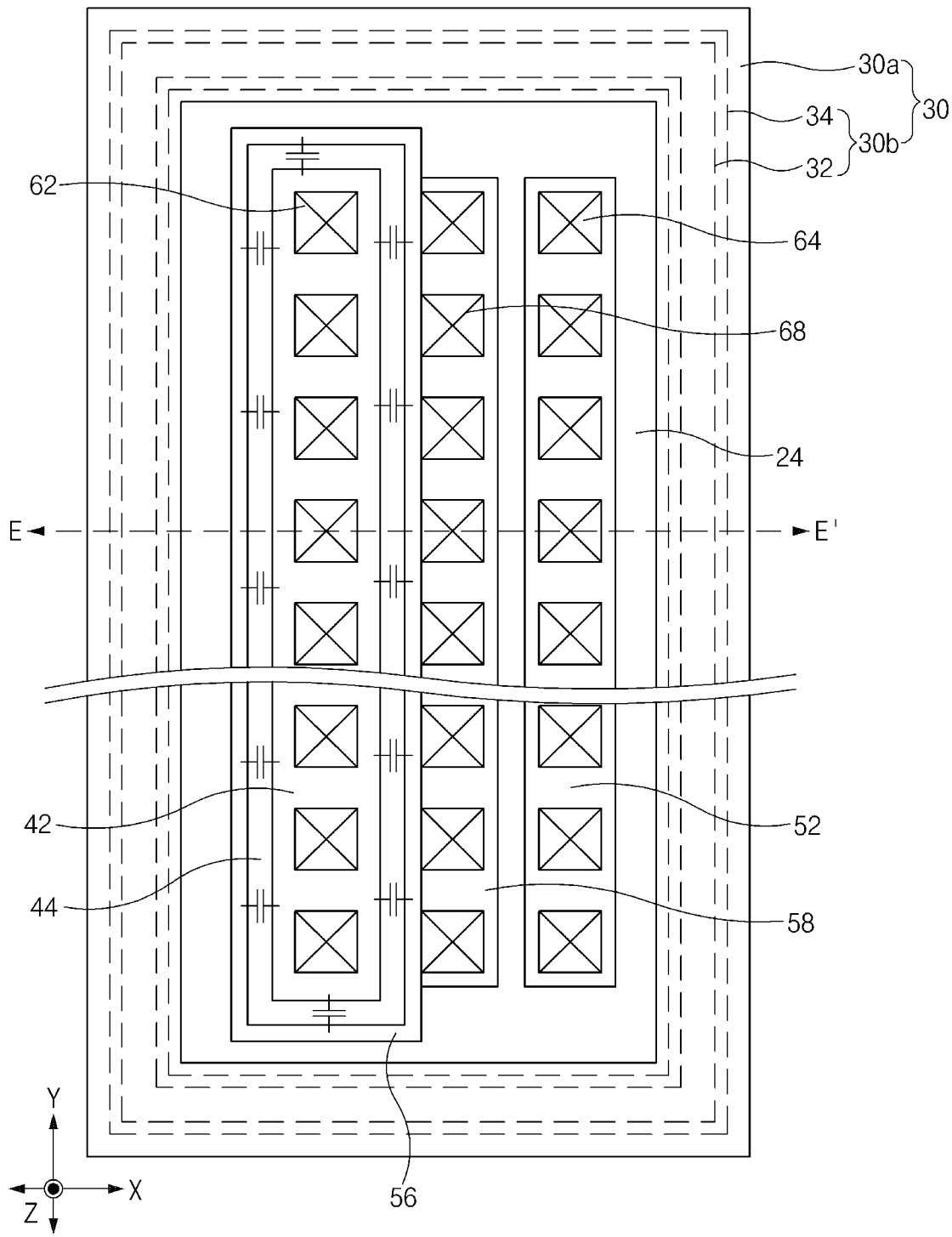
FIG. 13 is a schematic plan view illustrating an example of a vertical board-type capacitor based on one implementation of the disclosed technology.
Figure 14:
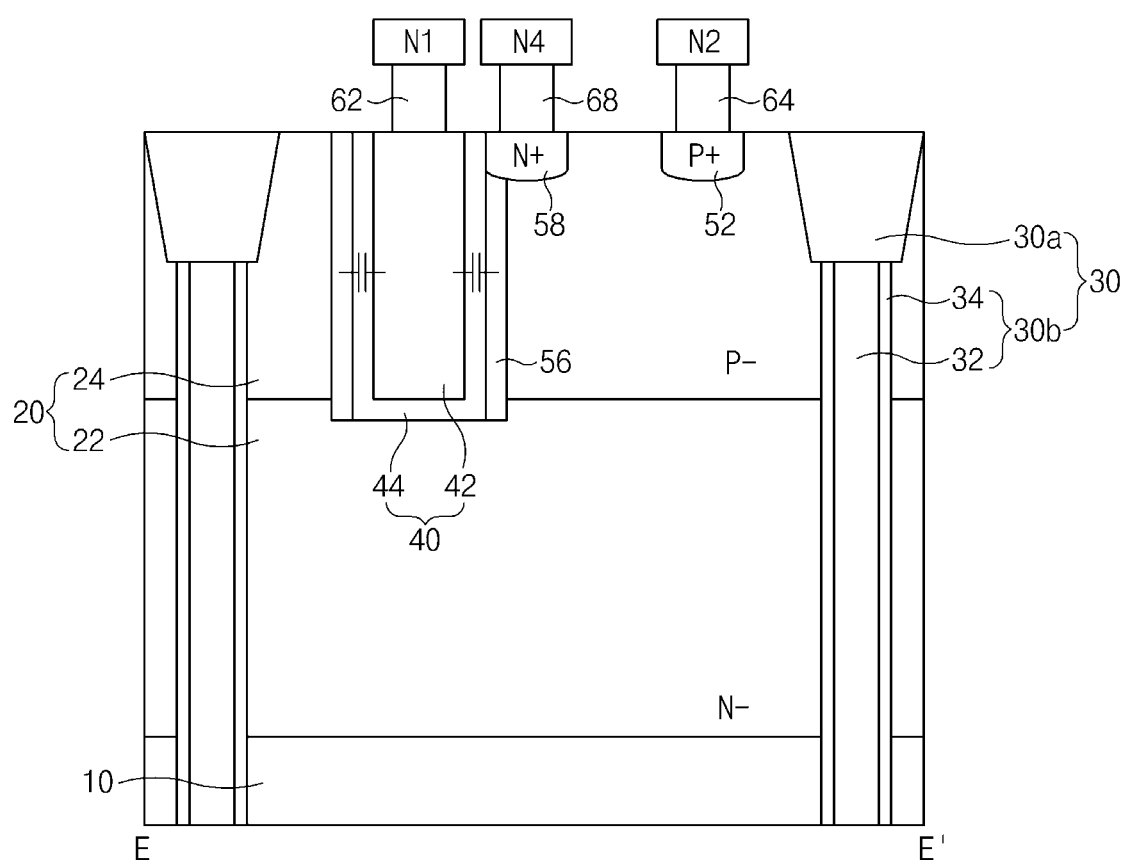
FIG. 14 is a cross-sectional view illustrating an example of the vertical board-type capacitor taken along the line E-E' shown in FIG. 13.

FIG. 13 is a schematic plan view illustrating a vertical board-type capacitor 7 based on one implementation of the disclosed technology. FIG. 14 is a cross-sectional view illustrating the vertical board-type capacitor 7 taken along the line E-E' shown in FIG. 13.

Referring to FIGS. 13 and 14, the vertical board-type capacitor 7 may further include an impurity region 56 and a junction 58 that are not included in the vertical board-type capacitor 1.

A lower portion of the impurity region 56 may be coupled to an impurity region 22, and an upper portion of the impurity region 56 may be coupled to the junction 58. Thus, the impurity region 56 may surround side surfaces of the recessed structure 40. The impurity region 56 may include an N-type impurity region (N).

The junction 58 may be coupled to the impurity region 56, such that the junction 58 may be formed at a upper portion of the impurity region 24. In some implementations, the junction 58 may be coupled to a node N4 through a contact 68, such that the junction 58 may be coupled to the impurity region 22 through the impurity region 56. The junction 58 may include an N-type impurity region (N+).

The vertical board-type capacitor 7 may be implemented as a vertical depletion-mode capacitor in which the impurity regions 58 and 22 formed in upper and lower portions of the recessed conductive film 42 may be interconnected by the impurity region 56 having the same-polarity impurities as those of the impurity regions 58 and 22.

In the implementation as shown in FIGS. 13 and 14, side surfaces of the recessed structure 40 are surrounded by the impurity region having the same-polarity impurities as those of the impurity region 22 and the bottom surface of the recessed structure is surrounded by the impurity region 22. Thus, the recessed structure 40 in the vertical board-type capacitor 7 is surrounded by the same-polarity impurity regions 22 and 56. This structure can be used to prevent undesired capacitance variation in the vertical board-type capacitor 7.

In the above-mentioned embodiments, the DTI structure 30b of the device isolation structure 30 may be formed in a manner that insulation films thereof may be formed in a multilayer structure in which the insulation films are horizontally stacked, or may be formed in a multilayer structure in which at least one conductive film and at least one insulation film are horizontally stacked. For example, a material film 32 for use in the DTI structure 30b may be formed of or include an insulation film or a conductive film (e.g., a polysilicon film).

If the material film 32 formed in the DTI structure 30b is formed of or includes a conductive film and receives a bias voltage as an input, noise can be prevented from occurring in a boundary region between the DTI structure 30b and each of the active regions 20 and 20'.

Figure 15:
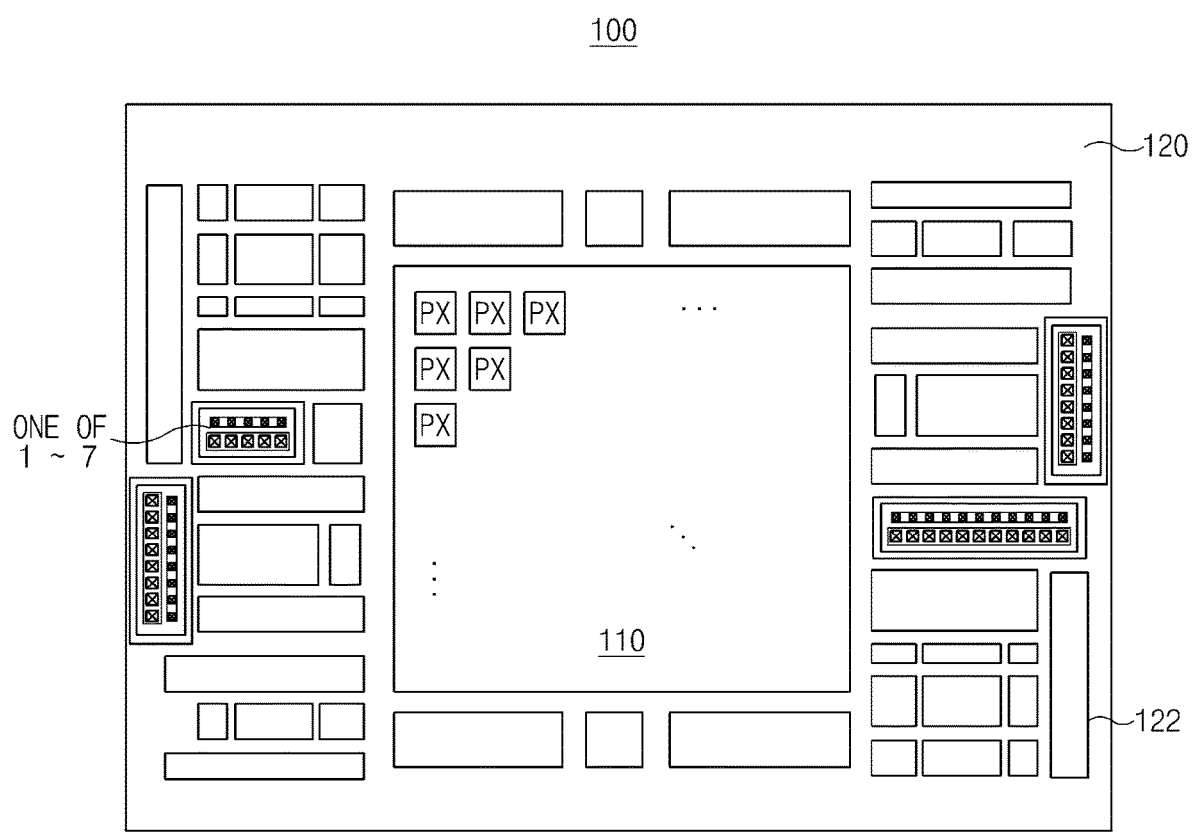
FIG. 15 is a view illustrating an example of an image sensing device including vertical board-type capacitors based on one implementation of the disclosed technology.

FIG. 15 is a view illustrating an image sensing device 100 provided with a plurality of vertical board-type capacitors based on one implementation of the disclosed technology.

Referring to FIG. 15, the image sensing device 100 may include a pixel region 110 and a peripheral region 120.

The pixel region 110 may include unit pixels (PXs) arranged in a two-dimensional (2D) matrix shape including rows and columns. The unit pixels (PXs) may include a red color (R), a green color (G), and a blue color (B), and may be arranged in a Bayer pattern shape. The unit pixels (PXs) may include at least one color filter, a microlens, a photoelectric conversion element (e.g., photodiode), and switching elements (e.g., a transmission (Tx) transistor, a reset transistor, a source follower transistor, and a selection transistor). The color filter may be formed to perform filtering of visible light so that only a light signal having a specific color (e.g., R, G, or B) can pass through the color filter. The microlens may be formed to focus incident light received from outside, and may transmit the focused incident light to the color filter. The photoelectric conversion element (e.g., photodiode) may be formed to store photocharges therein in response to incident light received through the color filter. Each of the switching elements (e.g., a transmission (Tx) transistor, a reset transistor, a source follower transistor, and a selection transistor) may be formed to read out photocharges stored in the photoelectric conversion element.

The peripheral region 120 may be located outside of the pixel region 110, and may include a plurality of logic circuit blocks 122 configured to process signals read out from the pixel region 110. In some implementations, in the peripheral region 120, any one or more of the vertical board-type capacitors 1 to 7 may be formed in a redundant space that remains unused after the formation of the logic circuit blocks 122. Each of the vertical board-type capacitors 1 to 7 may be used as a reservoir capacitor for voltage stabilization of the image sensing device 100.

Which one of the vertical board-type capacitors 1 to 7 will be formed may be determined based on the size of the redundant space. In some implementations, a plurality of vertical board-type capacitors having a same structure as one another can be formed in the peripheral region 120 of the image sensing device 100. In some implementations, vertical board-type capacitors which have different structures from one another may be formed in the peripheral region 120 of the image sensing device 100.

FIG. 15 discloses an exemplary case in which any one or more of the vertical board-type capacitors 1 to 7 are applied to the image sensing device. However, the disclosed technology is not limited to the implementation that the vertical board-type capacitors 1-7 are applied to the imaging sensing device and other implementations are also possible. For example, any one of the vertical board-type capacitors 1 to 7 may also be applied to electronic devices such as semiconductor devices which require a reservoir capacitor. For example, the vertical board-type capacitors 1 to 7 may be formed in a redundant space of the peripheral region that is located outside of the cell array region storing data.

As is apparent from the above description, the disclosed technology provides various implementations of the vertical board-type capacitor and the image sensing device including the vertical board-type capacitor. According to the disclosed technology, it is possible to increase capacitance per unit region of at least one capacitor.

While this patent document contains many specifics, these should not be construed as limitations on the scope of any invention or of what may be claimed, but rather as descriptions of features that may be specific to particular implementations of particular inventions. Certain features that are described in this patent document in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination. Moreover, the separation of various system components in the implementations described in this patent document should not be understood as requiring such separation in all implementations.

Only a few implementations and examples are described. Other implementations, enhancements and variations can be made based on what is described and illustrated.

What is claimed is:

1. An image sensing device comprising:
   a pixel region including image pixels, each image pixel including a photoelectric conversion element structured to produce and store photocharges in response to light received in the pixel region and switching elements structured to read out the photocharges stored in the photoelectric conversion element to produce pixel signals; and
   a peripheral region located outside of the pixel region,
   wherein the peripheral region includes:
   logic circuits located to receive the pixel signals from the pixel region and configured to process the pixel signals, and
   a capacitor located adjacent to the logic circuits,
   wherein the capacitor includes:
   an active region including a first impurity region and a second impurity region formed over the first impurity region,
   a recessed structure including a portion formed in the active region, the portion including a conductive layer extending along a direction that the first impurity region and the second impurity region are stacked and an insulation layer formed between the conductive layer and the active region, and
   a first junction formed in the active region and spaced apart from the recessed structure by a predetermined distance,
   wherein the active region is isolated from the logic circuits and the pixel region, and
   wherein the conductive layer has a bar shape in a horizontal plane and a board shape in a vertical plane.

2. The image sensing device according to claim 1, wherein the first impurity region and the second impurity region have different polarities from each other.

3. The image sensing device according to claim 1, wherein the first impurity region includes N-type impurities, and the second impurity region formed over the first impurity region includes P-type impurities.

4. The image sensing device according to claim 1, wherein the first junction includes a third impurity region having a same polarity as the second impurity region with a higher impurity density than that of the second impurity region.

5. The image sensing device according to claim 1, wherein the recessed structure extends to pass through the second impurity region.

6. The image sensing device according to claim 1, further comprising a second junction formed to have a same polarity as the first impurity region and configured to extend to pass through the second impurity region, the second junction being coupled to the first impurity region.

7. The image sensing device according to claim 6, wherein the second junction includes:
   a fourth impurity region formed to pass through the second impurity region and coupled to the first impurity region, the fourth impurity region having a same polarity as the first impurity region with a higher impurity density than that of the first impurity region; and
   a fifth impurity region formed at a upper portion of the fourth impurity region , and having a same polarity as the fourth impurity region with a higher impurity density than that of the fourth impurity region.

8. The image sensing device according to claim 1, further comprising an additional impurity region formed to surround a side surface of the recessed structure and having a same polarity as the first impurity region, the additional impurity region being in contact with the first impurity region.

9. The image sensing device according to claim 1, wherein the recessed structure is formed in the second impurity region without extending to the first impurity region.

10. The image sensing device according to claim 1, wherein the first impurity region and the second impurity region have a same polarity, the second impurity region having higher impurity density than that of the first impurity region.

11. The image sensing device according to claim 1, wherein the first impurity region and the second impurity region include N-type impurities.

12. The image sensing device according to claim 1, wherein the first junction is formed at a upper portion of the second impurity region and includes P-type impurities.

13. An image sensing device comprising:
    a pixel region including image pixels and structured to produce pixel signals in response to light received in the pixel region; and
    a peripheral region located outside of the pixel region, wherein the peripheral region includes:
    logic circuits located to receive the pixel signals from the pixel region and configured to process the pixel signals, and
    a capacitor located adjacent to the logic circuits, wherein the capacitor includes:
    an active region including a first impurity region and a second impurity region formed over the first impurity region,
    a recessed structure including a portion formed in the active region, the portion including a conductive layer extending along a direction that the first impurity region and the second impurity region are stacked and an insulation layer formed between the conductive layer and the active region, and
    a first junction formed in the active region and spaced apart from the recessed structure by a predetermined distance,
    wherein the active region is isolated from the logic circuits and the pixel region,
    wherein the conductive layer has a bar shape in a horizontal plane and a board shape in a vertical plane, and
    wherein the active region is isolated from the logic circuits and the pixel region by a device isolation structure and a portion of the insulation layer is in contact with the device isolation structure.

14. The image sensing device according to claim 13, wherein the portion of the insulation layer in contact with the device isolation structure includes a side surface of the recessed structure disposed further away from the first junction than the other side surface of the recessed structure not in contact with the device isolation structure.

15. An image sensing device comprising:
    a pixel region including image pixels and structured to produce pixel signals in response to light received in the pixel region; and
    a peripheral region located outside of the pixel region, wherein the peripheral region includes:
    logic circuits located to receive the pixel signals from the pixel region and configured to process the pixel signals, and
    a capacitor located adjacent to the logic circuits, wherein the capacitor includes:
    an active region including a first impurity region and a second impurity region formed over the first impurity region,
    a recessed structure including a portion formed in the active region, the portion including a conductive layer extending along a direction that the first impurity region and the second impurity region are stacked and an insulation layer formed between the conductive layer and the active region, and
    a first junction formed in the active region and spaced apart from the recessed structure by a predetermined distance,
    wherein the active region is isolated from the logic circuits and the pixel region, and
    wherein the conductive layer has a bar shape in a horizontal plane and a board shape in a vertical plane, and
    wherein the active region is isolated from the logic circuits and the pixel region by a device isolation structure including a shallow trench isolation (STI) structure and a deep trench isolation (DTI) structure that are stacked upon one another.

16. The image sensing device according to claim 15, wherein the deep trench isolation (DTI) structure includes insulation materials or the deep trench isolation (DTI) structure includes a conductive material and an insulation material.

\* \* \* \* \*